(12) United States Patent
Lin

(10) Patent No.: US 10,838,638 B2
(45) Date of Patent: Nov. 17, 2020

(54) FLASH MEMORY CONTROLLER, METHOD FOR MANAGING FLASH MEMORY MODULE AND ASSOCIATED ELECTRONIC DEVICE

(71) Applicant: Silicon Motion Inc., Hsinchu County (TW)

(72) Inventor: Wen-Sheng Lin, Kaohsiung (TW)

(73) Assignee: Silicon Motion, Inc., Hsinchu County (TW)

( * ) Notice: Subject to any disclaimer, the term of this patent is extended or adjusted under 35 U.S.C. 154(b) by 22 days.

(21) Appl. No.: 16/412,452

(22) Filed: May 15, 2019

(65) Prior Publication Data

US 2020/0057572 A1 Feb. 20, 2020

(30) Foreign Application Priority Data

Aug. 17, 2018 (TW) .............................. 107128721 A

(51) Int. Cl.
*G06F 3/06* (2006.01)
*G06F 1/20* (2006.01)
*G06F 12/02* (2006.01)
*G11C 16/08* (2006.01)
*H03M 13/37* (2006.01)

(52) U.S. Cl.
CPC ............ *G06F 3/0634* (2013.01); *G06F 1/206* (2013.01); *G06F 3/064* (2013.01); *G06F 3/0611* (2013.01); *G06F 3/0679* (2013.01); *G06F 12/0246* (2013.01); *G11C 16/08* (2013.01); *H03M 13/3707* (2013.01)

(58) Field of Classification Search
CPC .... G06F 3/0634; G06F 3/0611; G06F 3/0679; G06F 3/064; G06F 3/0656; G06F 3/0619; G06F 3/0652; G06F 1/206; G06F 12/0246; G06F 2212/7206; G06F 2212/7201; G06F 13/16; G06F 11/1441; G06F 11/1451; G06F 2203/0691; G11C 16/08; G11C 16/20; G11C 16/26; G11C 2229/0409; G11C 2229/0411; G11C 29/52; H03M 13/3707; H03M 13/1108; H03M 13/1111; H03M 13/3715
See application file for complete search history.

(56) References Cited

U.S. PATENT DOCUMENTS 9,239,754 B2 1/2016 Wu
10,387,246 B2 * 8/2019 Barndt ............. H03M 13/2948
(Continued)

*Primary Examiner* — Hiep T Nguyen
(74) *Attorney, Agent, or Firm* — Winston Hsu

(57) ABSTRACT

The present invention provides a flash memory controller, wherein the flash memory controller includes a read-only memory, a microprocessor and a decoder, wherein the read-only memory is configured to store a program code, the microprocessor is configured to execute the program code to access a flash memory module, and the decoder includes a hard decoding function and a soft decoding function. In the operations of the flash memory controller, when the flash memory controller and the flash memory module are powered-on, the flash memory controller reads data from a specific block of the flash memory module, and the decoder determines if disabling the soft decoding function or not according to a status of the specific block or a status of the data.

13 Claims, 5 Drawing Sheets

(56) References Cited

U.S. PATENT DOCUMENTS

| | | | |
|---|---|---|---|
| 2013/0139035 A1* | 5/2013 | Zhong | G06F 11/1068 714/773 |
| 2014/0040531 A1* | 2/2014 | Wu | G11C 16/26 711/103 |
| 2014/0089764 A1* | 3/2014 | Goldman | G11C 16/34 714/773 |
| 2015/0043277 A1* | 2/2015 | Fitzpatrick | G06F 3/064 365/185.11 |
| 2015/0143068 A1* | 5/2015 | Higgins | G06F 12/0238 711/166 |
| 2015/0227314 A1* | 8/2015 | Chen | G11C 29/52 714/764 |
| 2016/0077914 A1* | 3/2016 | Zeng | H03M 13/3723 714/764 |
| 2019/0190541 A1* | 6/2019 | Tao | H03M 13/3715 |

* cited by examiner

FLASH MEMORY CONTROLLER, METHOD FOR MANAGING FLASH MEMORY MODULE AND ASSOCIATED ELECTRONIC DEVICE

BACKGROUND OF THE INVENTION

1. Field of the Invention

The present invention relates to a flash memory, and more particularly, to a decoder in a flash memory controller.

2. Description of the Prior Art

A decoder that is configured in a flash memory controller generally comprises both hard decoding and soft decoding functions, wherein the number of bits that are able to be corrected by the hard decoding function is fewer compared with the soft decoding function, but the soft decoding function requires more decoding time than the hard decoding function. For example, it takes 40 millisecond for the hard decoding function to decode a chunk, while it takes 70 millisecond (ms) for the soft decoding function to decode a chunk. Hence, it is preferred that the decoder uses the hard decoding function initially to decode data, and the soft decoding function to decode data may be further used if the hard decoding function fails. However, if the currently read data all comes from unstable pages within the flash memory module, both the hard and soft decoding will have to be used when applying the aforementioned method, that is, it will take 110 to decode each chunk, thereby making the decoding time too long.

Further, according to related art methods, when the flash memory controller and the flash memory module are just powered-on, the lastly-written block before the power-on will be scanned in order to determine the data quality and accordingly determine whether any abnormal power-off event has happened, such as the power-off recovery (POR) or sudden power-off recovery (SPOR). If it is determined that there has been abnormal power-off events, data restoring will be performed for some lastly-written data before the power-on, that is, reading out the data and then rewritten the data back to the flash memory module. However, since the data comes from unstable pages within the flash memory module (due to the previous abnormal power-off), the data restoring time will be too long and thereby prolonging the overall power-on duration, which greatly lowers the user experience.

SUMMARY OF THE INVENTION

Hence, an objective of the present invention is to provide a flash memory controller, which is capable of selectively disabling the soft decoding function during the data restoring operation following the powering-on of the flash memory controller and the flash memory module, in order to prevent the power-on duration from being prolonged which lowers the user experience.

An embodiment of the present invention discloses a flash memory controller, which is arranged to access a flash memory module and comprises multiple blocks. The flash memory controller further comprises a read-only memory (ROM), a microprocessor, and a decoder. The read-only memory (ROM) is arranged to store a program code. The microprocessor is arranged to execute the program code in order to control the access of the flash memory module. The decoder comprises a hard decoding function and a soft decoding function. When the flash memory controller and the flash memory module are powered-on, the flash memory controller reads data from a specific block in the flash memory module, and the decoder determines whether to disable the soft decoding function during decoding the data according to at least the state of the specific block or the state of the data.

Another embodiment of the present invention discloses a method of managing a flash memory module, wherein the flash memory module comprises multiple blocks, and the method comprises: when the flash memory module is powered-on, reading data from a specific block in the flash memory module; and determining a setting of a decoder at least according to the state of the specific block or the state of said data, in order to control the decoder whether to disable a soft decoding function during decoding said data and to only use a hard decoding function to decode at least one portion of said data.

Yet another embodiment of the present invention discloses an electronic device which comprises a flash memory module and a flash memory controller, wherein the flash memory module comprises multiple blocks. The flash memory controller is arranged to access the flash memory module, wherein the flash memory controller comprises: a ROM arranged to store a program code; a microprocessor arranged to execute the program code in order to control the access of the flash memory module; and a decoder comprising a hard decoding function and a soft decoding function. When the flash memory controller and the flash memory module are powered-on, the flash memory controller reads data from a specific block of the flash memory module, and the decoder determines whether to disable the soft decoding function during decoding said data at least according to the state of the specific block or the state of said data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
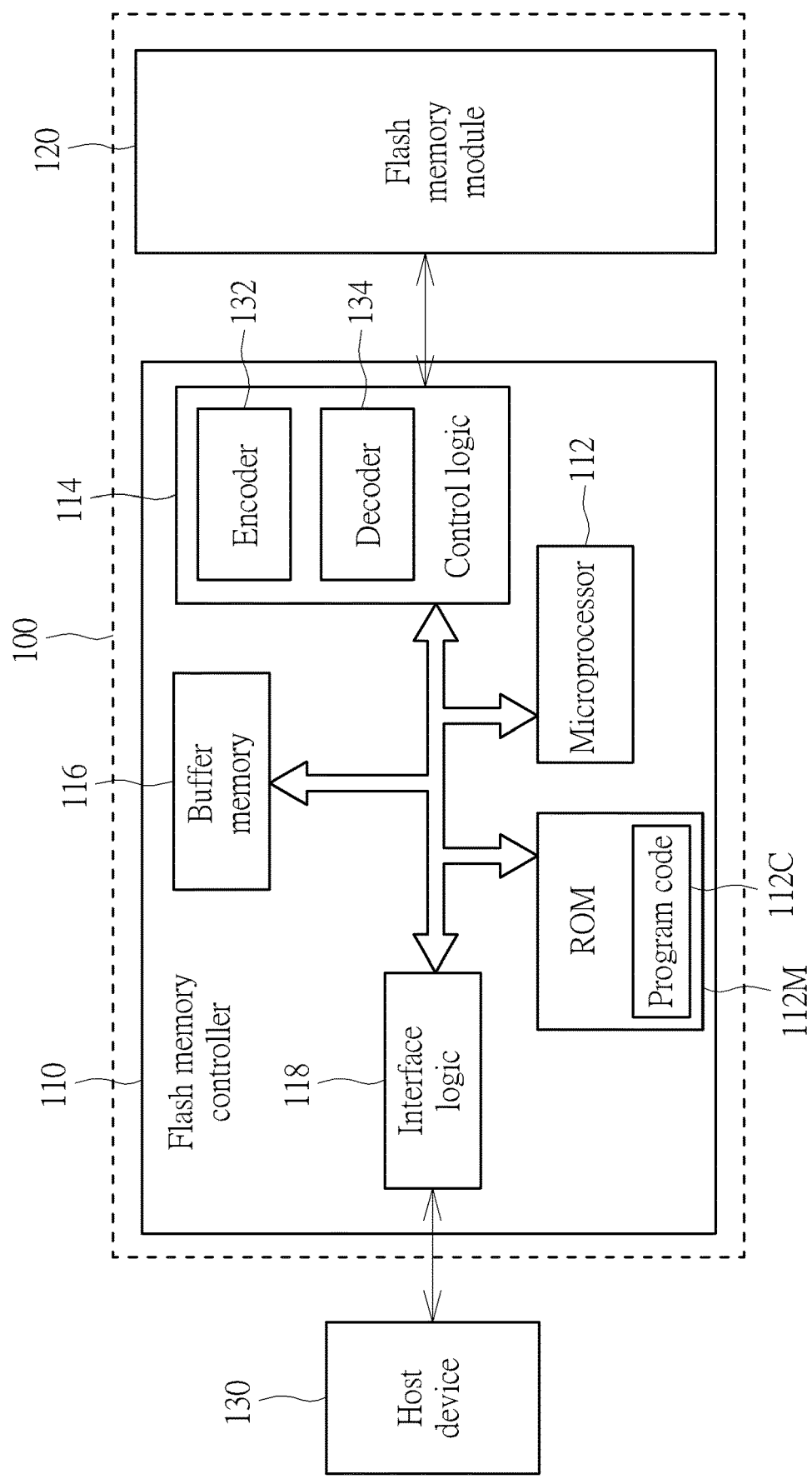
FIG. 1 is a diagram illustrating a memory device according to an embodiment of the present invention.

FIG. 1 is a diagram illustrating a memory device 100 according to an embodiment of the present invention. The memory device 100 comprises a flash memory module 120 and a flash memory controller 110, wherein the flash memory controller 110 is arranged to access the flash memory module 120. According to this embodiment, the flash memory controller 110 comprises a microprocessor 112a, a read-only memory (ROM) 112M, a control logic 114, a buffer memory 116, and an interface logic 118. The ROM 112M is arranged to store a program code 112C, and the microprocessor 112a is arranged to execute the program code 112C in order to control the access of the flash memory module 120. The control logic 114 comprises an encoder 132 and a decoder 134, wherein the encoder 132 is arranged to encode the data written into the flash memory module 120 in order to generate a corresponding check node (also known as "error correction code" (ECC)), and the decoder 134 is arranged to decode the data read from the flash memory module 120.

Typically, the flash memory module 120 may comprise multiple flash memory chips, each comprising a plurality of blocks. The flash memory controller 110 adopts "block" as the unit of erasing data from the flash memory module 120. Further, a block may record a certain number of pages, wherein the flash memory controller 110 adopts "page" as the unit of writing data into the flash memory module 120. In this embodiment, the flash memory module 120 may be a 3D NAND-type flash module.

In practice, with the microprocessor 112a executes the program code 112C, the flash memory controller 110 may utilize its own inner elements to perform various operations, such as, utilizing the control logic 114 to control the access operation of the flash memory module 120 (especially the access operations for at least a block or at least a page), utilizing the buffer memory 116 to perform the required buffering process, and utilizing the interface logic 118 to communicate with a host device 130. The buffer memory 116 is implemented with a random access memory (RAM). For example, the buffer memory 116 may be a static state random access memory (Static RAM, or SRAM), but the present invention is not limited thereto.

In an embodiment, the memory device 100 may be a portable memory device (e.g. a memory card conforming to the SD/MMC, CF, MS, XD specifications), and the host device 130 may be an electronic device connectable to the memory device, such as a cellphone, laptop computer, desktop computer, etc. In another embodiment, the memory device 100 may be a solid state drive (SSD) or an embedded storage device conforming to the Universal Flash Storage (UFS) specification or the Embedded Multi Media Card (EMMC) specification, so as to be arranged in an electronic device (such as a cellphone, laptop computer, desktop computer, etc.), and the host device 130 may be a processor of said electronic device.

Figure 2:
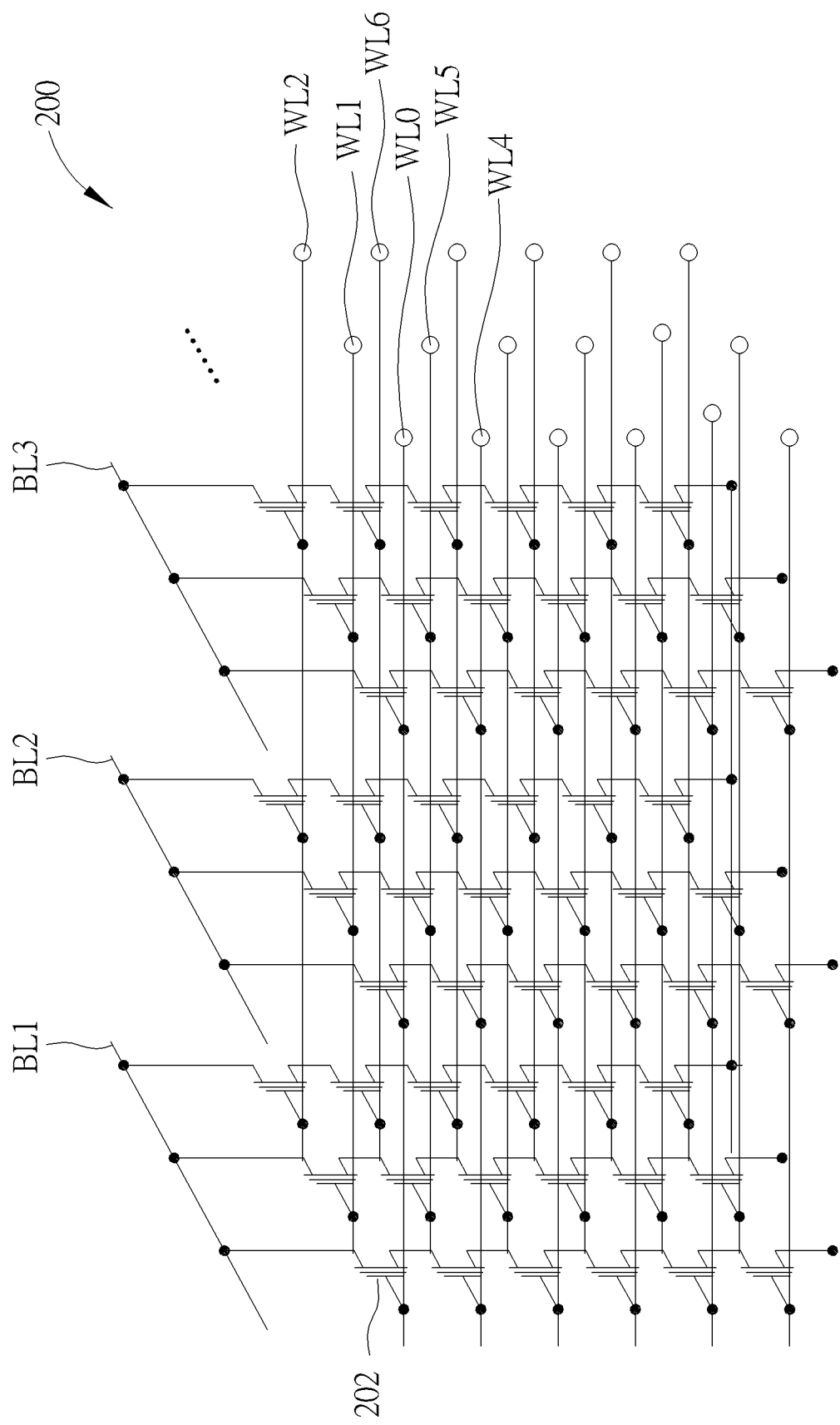
FIG. 2 is a diagram illustrating a block in the flash memory module according to an embodiment of the present invention.

FIG. 2 is a diagram illustrating a block 200 in the flash memory module 120 according to an embodiment of the present invention, wherein the flash memory module 120 may be a 3D NAND-TYPE flash memory. As shown in FIG. 2, the block 200 comprises multiple memory units (e.g. the floating-gate transistor 202 or other charge trap element), which form the 3D NAND-TYPE flash memory mechanism via multiple bit lines (e.g. the bit lines BL1-BL3 shown in the figure, but the present invention is not limited thereto) and word lines (e.g. the word lines WL0-WL2, WL4-WL6 shown in the figure). Take the uppermost plane in in FIG. 2 as example, all floating-gate transistors on the word line WL0 form at least one page, all floating-gate transistors on the word line WL1 format least another page, and all floating-gate transistors on the word line WL2 further form yet at least another page, and so on. Further, due to different writing manners of the flash memory, the definition of the relationship between the word line WL0 and the page (i.e. the logic page) will also be different. Specifically, when writing with the single-level cell (Single-Level Cell, SLC) technique, all floating-gate transistors on the word line WL0 are only corresponding to one single logic page; when writing with the Multi-Level Cell MLC), all floating-gate transistors on the word line WL0 are corresponding to two logic pages; when writing with the Triple-Level Cell, TLC) technique, all floating-gate transistors on the word line WL0 are corresponding to three logic pages; and when writing with the Quad-Level Cell (QLC) technique, all floating-gate transistors on the word line WL0 are corresponding to four logic pages. Since one skilled in the art should be readily to understand the structure of the 3D NAND-TYPE flash memory and the relationship between word lines and pages, the detailed descriptions are omitted here for brevity.

As shown in the mechanism of FIG. 2, said multiple word lines may be defined as a word line set which comprises a portion of the control circuit. When failure occurs upon writing data to the floating-gate transistor of a word line within the word line set (which indicates that writing fails), errors will correspondingly occur on other word lines of the word line set. In an embodiment, word lines located on the same plane will be defined as a word line set. Refer to FIG. 2, assume there are four bit lines on the same plane, the word lines WL0-WL3 will be arranged in a first word line set, and the word line WL4-WL7 will be arranged in a second word line set, and so on. Assume the manner of the flash memory controller 110 writing data to the pages of the first word line set is to sequentially write data to the floating-gate transistor 202 in the word lines WL0, WL1, WL2, WL3, and all data on the word lines WL0, WL1, WL2 has been written successfully, when data written into the word line WL3 has errors, the data which was successfully written on the word lines WL0, WL1, WL2 might also have errors now. Similarly, assume the manner of the flash memory controller 110 writing data into the pages of the second word line set is to sequentially write data into the floating-gate transistor 202 in the word lines WL4, WL5, WL6, WL7, and assume errors occur during writing data to the word line WL4, this will correspondingly make the word lines WL5, WL6, WL7 unstable and thus are no longer suitable for data writing.

In this embodiment, the decoder 134 is a low-density parity check code (LDPC code) decoder, and the decoder 134 comprises both the hard decoding function and the soft decoding function. The hard decoding function reads each memory unit in the flash memory module 120 (e.g. the floating-gate transistor 202) with traditional reading method and then decodes for said each memory unit. The soft decoding function requires more different reading voltages to read said each memory unit in order to obtain more information and provide the information to the decoder 134 in the form of probability statistics, for follow-up decoding operations. In this embodiment, the number of correctable bits of the hard decoding function is smaller than that of the soft decoding function, but the decoding session required by the soft decoding function is longer than that required by the hard decoding function. For example, the hard decoding function requires about only 40 millisecond to decode a chunk, while the soft decoding function requires about 70 millisecond to decode a chunk.

Figure 3:
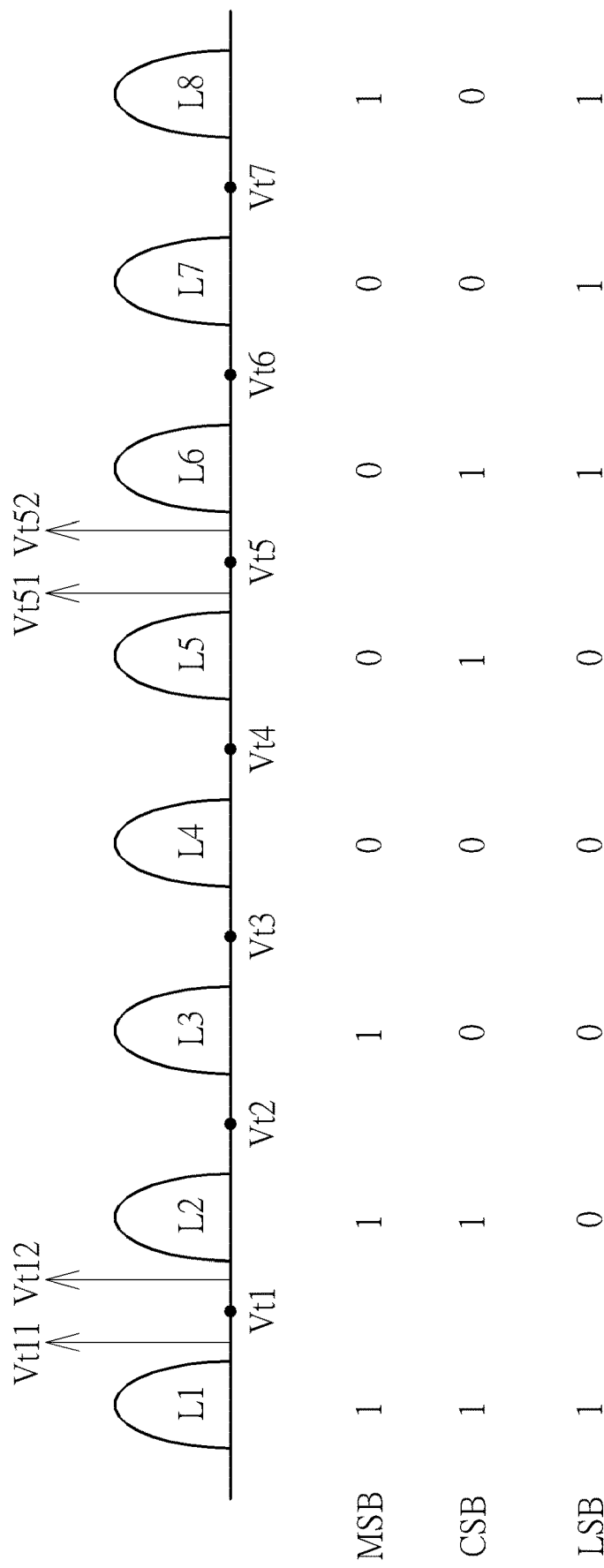
FIG. 3 is a diagram illustrating the writing voltage levels, threshold voltages and auxiliary voltages in a page.

Refer to FIG. 3, which describes multiple writing voltage levels L1-L8 and multiple threshold voltages Vt1-Vt7 when using triple-level cell (TLC) as the block 200. As shown in FIG. 3, each floating-gate transistor 202 may be programmed to have the voltage level L1 (i.e. (MSB, CSB, LSB)=(1, 1, 1)), the voltage level L2 (i.e. (MSB, CSB, LSB)=(1, 1, 0), the voltage level L3 (i.e. (MSB, CSB, LSB)=(1, 0, 0), the voltage level L4 (i.e. (MSB, CSB, LSB)=(0, 0, 0), the voltage level L5 (i.e. (MSB, CSB, LSB)=(0, 1, 0), the voltage level L6 (i.e. (MSB, CSB, LSB)=(0, 1, 1), the voltage level L7 (i.e. (MSB, CSB, LSB)=(0, 0, 1) or the voltage level L8 (i.e. (MSB, CSB, LSB)=(1, 0, 1)). When the memory controller 110 needs to read the least significant bit (LSB) in the floating-gate transistor 202, the flash memory controller 110 will use the threshold voltage Vt1 and two auxiliary voltages Vt11, Vt12 respectively at left and right to read the floating-gate transistor 202, and use the threshold voltage Vt5 and two auxiliary voltage Vt51, Vt52 respectively at left and right to read the floating-gate transistor 202. This operation generates "1" or "0" according to the on-off state of the floating-gate transistor 202 (for example, the on-off state can be determined by detecting whether current is generated), for the decoder 134 to perform decoding operations. In this example, the information (i.e. "1" or "0") read by the threshold voltages Vt1 and Vt5 may be viewed as sign bits; and the information (i.e. "1" or "0") read by the auxiliary voltages Vt11, Vt12, Vt51, Vt52 may be viewed as soft bits. The hard decoding function of the decoder 134 uses sign bits to perform decoding operations, while the soft decoding function of the decoder 134 uses both sign bits and soft bits to perform decoding operations.

Similarly, when the memory controller 110 needs to read the central significant bits (CSBs) in the floating-gate transistor 202, the memory controller 110 will use the threshold voltages Vt2, Vt4 and Vt6 as well as the auxiliary voltages thereof (not shown in the figure) to read the floating-gate transistor 202, and generate "1" or "0" according to the on-off state of the floating-gate transistor 202 (depending on whether there is current generated), for the decoder 134 to perform decoding operations. Similarly, when the memory controller 110 needs to read the most significant bits (MSBs) in the floating-gate transistor 202, the memory controller 110 will use the threshold voltages Vt3 and Vt7 as well as the auxiliary voltages thereof (not shown in the figure) to read the floating-gate transistor 202, and determine whether the MSB is "1" or "0" according to the on-off state of the floating-gate transistor 202 (whether current is generated or not), for the decoder 134 to perform decoding operations.

It should be noted that the example shown in FIG. 3 is only to draw attention to the difference between the hard decoding function and the soft decoding function, and should not be taken as a limitation of the present invention. Specifically, the number and location of the aforementioned auxiliary voltage may be changed according to the actual design requirements, or may be processed by using the bit values generated by the threshold voltage or auxiliary voltages (or using a look-up table (LUT)) to generate a corresponding codeword, and then transmit this corresponding codeword to the decoder 134 for processing. Since one skilled in the art should be readily to understand how to apply the above embodiment onto single-level storage blocks and multi-level storage blocks (including quadruple-level storage blocks) after reading the above related content in FIG. 3, the detailed descriptions are omitted here for brevity.

In general, before the flash memory controller 110 and the flash memory module 120 are powered-on, the data quality of some lastly-written blocks are determined in advance so as to accordingly determine whether there was abnormal power failure. If it is determined that there was abnormal power failure, a data-restoring operation may be performed on the lastly-written blocks. However, since the lastly-written page is an unstable page, there will be many error bits due to the influence of the abnormal power failure, making each page requires both the hard decoding and the soft decoding to operate. This makes the aforementioned data-restoring operation too long, thereby elongating the boot time of the electronic device. To solve this problem, the flash memory controller 110 in this embodiment may determine where there is abnormal power failure before powering-on, and accordingly turn on or off the soft decoding function of the decoder 134 in a dynamic manner, in order to prevent from elongating of the boot time.

Figure 4:
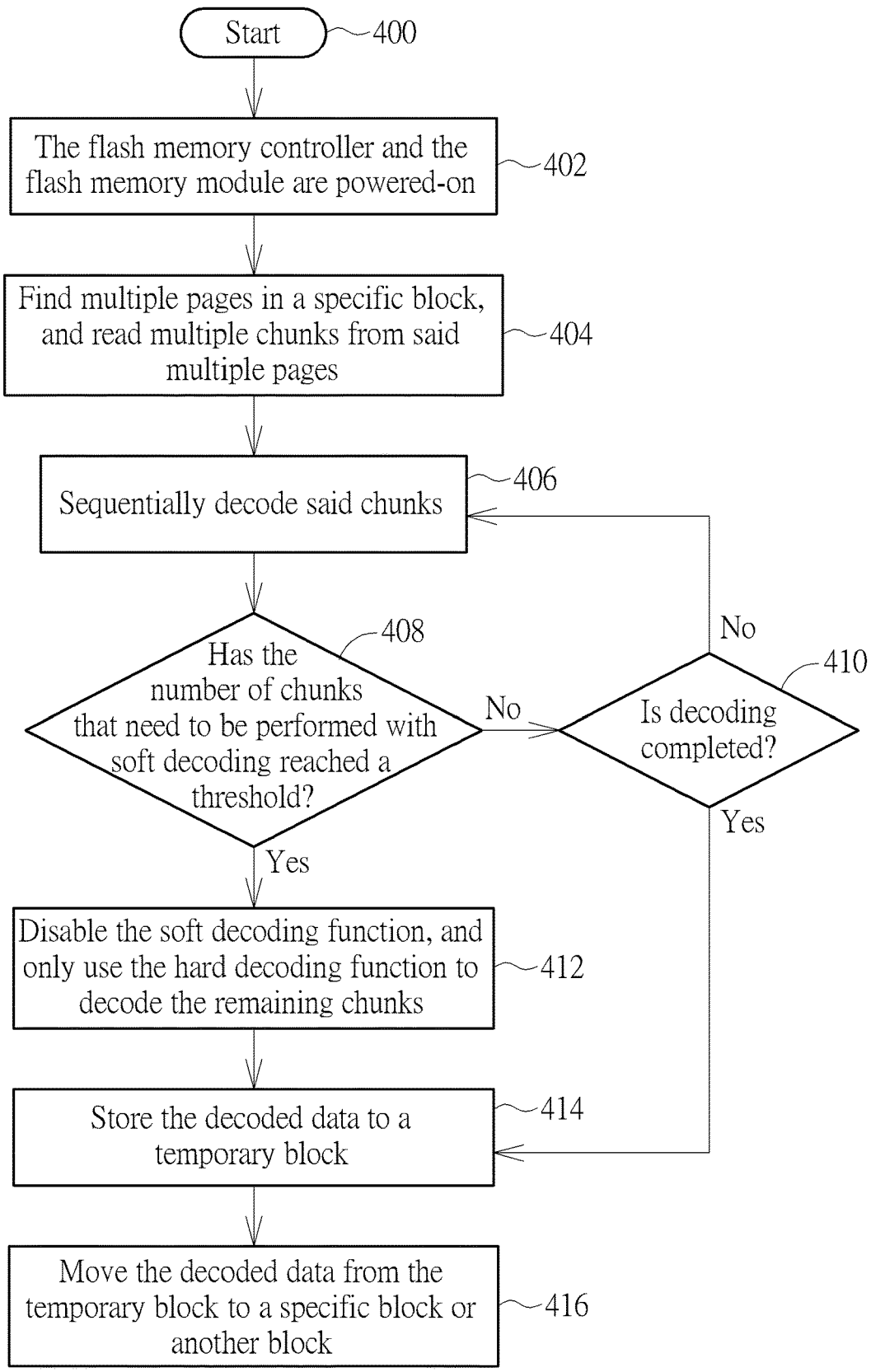
FIG. 4 is a flowchart illustrating the flow of managing a flash memory module according to an embodiment of the present invention.

To be more specific, please refer to FIG. 4, which is a flowchart illustrating the flow of managing a flash memory module 120 according to an embodiment of the present invention. In Step 400, the flow begins. In Step 402, the flash memory controller 110 and the flash memory module 120 are powered-on and perform the initialization operation, and the decoder 134 enables the hard decoding function and the soft decoding function. At this moment, the flash memory controller 110 may determine whether there was abnormal power failure before powering-on. For example, when the memory device 100 is normally powered-off, the flash memory controller 110 will store temporary tables and data in the buffer memory 116 to the flash memory module 120 which comprises a flag for denoting whether the memory device 100 is powered-off normally. Hence, after being powered-on, the flash memory controller 110 may determine whether there was an abnormal power failure in the memory device 100 via reading the aforementioned flag stored in the flash memory module 120. For example, the abnormal power failure state can be determined when the aforementioned flag is not set correctly. In another embodiment, the flash memory controller 110 may sequentially read all pages of blocks that are written before the memory device 100 is powered-on, in order to determine whether there is data in pages that is unable to be correctly read (i.e. unable to be corrected by using an ECC). The memory device 100 will be determined as having encountered abnormal power failure if data in pages cannot be correctly read. In this embodiment and the following descriptions, the memory device 100 is assumed to have encountered an abnormal power failure.

Figure 5:
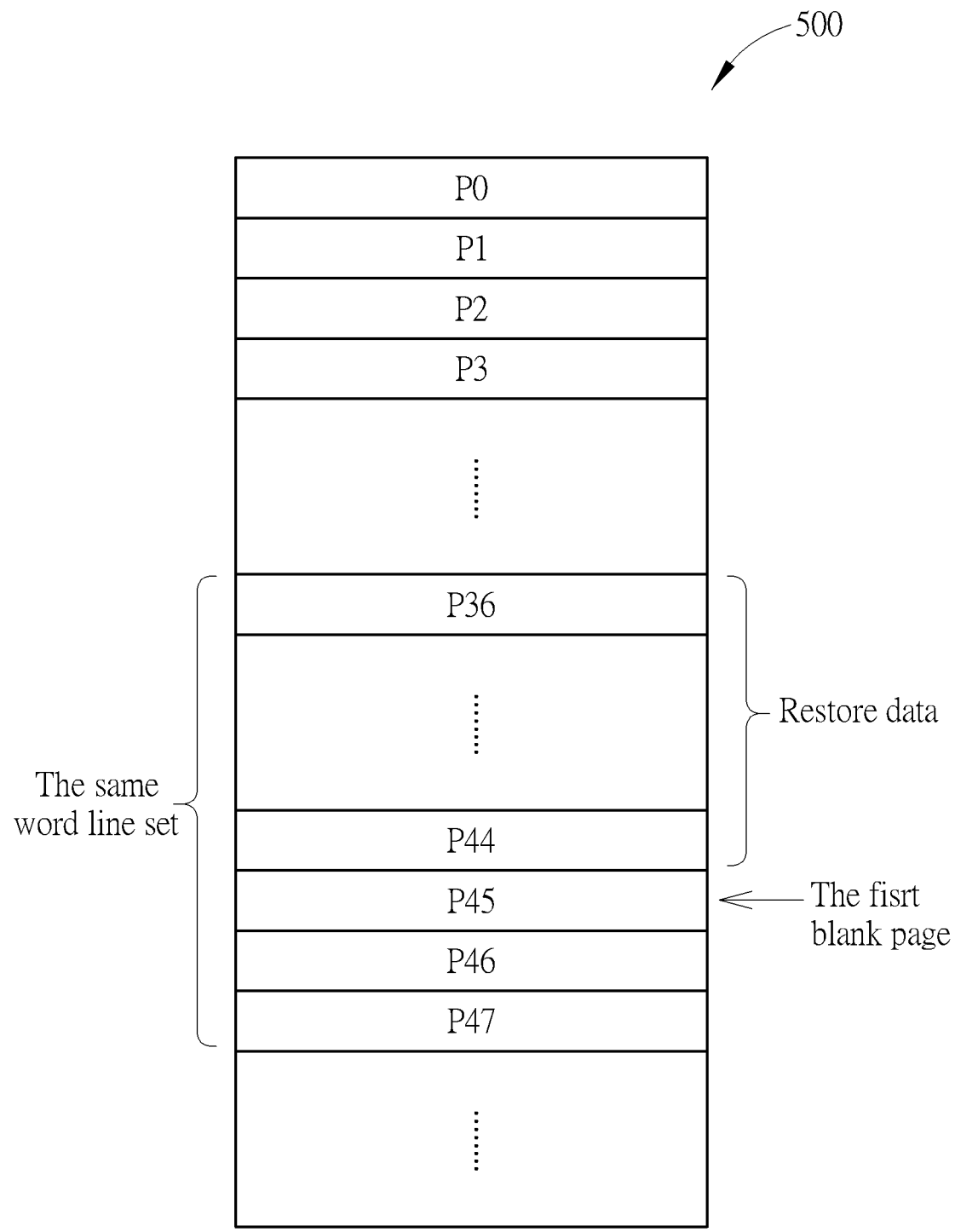
FIG. 5 is a diagram illustrating the pages in a specific block that require to be performed with data restoring.

In Step 404, the microprocessor 112a find a first blank page of a specific block in the flash memory module 120, wherein the specific block is the lastly-written page block before the flash memory module 120 is powered-on. The first blank page can be used to search backwardly to find lastly-written pages in specific blocks. Specifically, please refer to FIG. 5, which is a diagram illustrating the pages in a specific block 500 that require to be performed with data restoring. Assume the first blank page in the specific block 500 is P45, the microprocessor 112a may determine that the page P44 of the specific block 500 is the lastly-written page before the power failure occurs, and the microprocessor 112a may determine that all pages in the same word line set where the page P44 belongs to might be unstable pages which need to be performed with data restoring (but this is not a limitation of the present invention), wherein each page comprises multiple chunks or sectors, and each chunk is an encoding/decoding unit employed by the encoder 132 and the decoder 134. In this embodiment, since pages P36-P47 belong to the same word line set, the pages P36-P44 are determined as pages required data restoring.

It should be noted that the aforementioned method of determining pages as unstable and requiring data restoring is merely for illustrative purposes. Other embodiments of the present invention may employ an alternative method, such as determining all pages (e.g. P24-P35) in adjacent word line sets as unstable and requiring data restoring. Another alternative method is to determine all pages in the specific block 500 as unstable and requiring data restoring.

Next, in Step 406, the decoder 134 sequentially decodes multiple chunks of said multiple pages (the pages that are determined as unstable and requiring data restoring, e.g.

P36-P44). During decoding, the decoder 134 performs hard decoding upon the first chunk. If the decoding succeeds, the decoder 134 goes on to perform hard decoding on the next chunk; and if the decoding fails, the decoder 134 performs soft decoding on the first chunk, and so on. In the decoding process mentioned in Step 408, during sequentially decoding said multiple chunks, the decoder 134 accumulates whether the number of chunks that need to be performed with soft decoding reaches a threshold (e.g. 4 chunks, no matter the soft decoding is successful or not). If the decoder 134 detects that the number of the chunks that require to be decoded with the soft decoding function has reached four, this suggests that said multiple pages should be unstable pages. Nonetheless, the follow-up chucks may still be decoded by using the soft decoding function during the decoding process, making the overall booting period too long. Hence, the flow then goes to Step 412. However, under the situation where the number of the chunks that require to be decoded by the soft decoding function is smaller than the threshold, the flow goes to Step 410 to determine whether all chunks have been decoded or not.

In Step 410, if all chunks have been decoded, the flow gores to Step 414. In Step 412, the decoder 134 disables its soft decoding function, and only uses the hard decoding function to decode the remaining chunks. After the decoding is completed, the decoder 134 moves the decoded data to a temporary block (Step 414). In this embodiment, a single-level storage block may be used as the temporary block. Finally, in Step 416, after all the decoded data has been stored into the temporary block, the microprocessor 112a further moves the decoded data from the temporary block to the page following the specific block 500 or another block, and recreates a logic address and physical address mapping table of the decoded data.

Further, when the abnormal power failure occurs, all pages belonging to the same word line set where the page P44 belongs likely have become unstable pages. Hence, the microprocessor 112a may write dummy data into a subsequent part of pages, e.g., writing dummy data into the pages P45-P47 that belongs to the same word line set of the page P44, or even also writing dummy data to all pages (e.g. P48-P59) in the next word line set, in order to prevent important data from being written into those pages in the future, which can make the data quality unstable.

In the decoding process of the embodiment shown in FIG. 4, by determining whether the number of chunk that need to be decoded with soft decoding function is too large (i.e. by determining whether abnormal power-off has occurred or data storing quality is not good enough) to disable the soft decoding function of the decoder 134 in order to speed up the boot process, thus solving the problem of the soft decoding function being used too often during the data decoding process which is encountered in related art techniques.

It should be noted that during the decoding process, there may be still portions of chunks of the aforementioned decoder 134 that cannot be successfully decoded even by using the soft decoding function, and after the decoder 134 disables the soft decoding function and only decodes for the remaining chunks, the situation that some portions of chunks cannot be successfully decoded might occur. In this case, the microprocessor 122 and the decoder 134 may directly give up these chunks (rather than generating corresponding decoded data for these chucks), and give up on creating the logic addresses and physical address mapping table for these chunks.

In the embodiment of FIG. 4, the decoder 134 accumulates the number of chunks that need to be decoded with the soft decoding function has reached a threshold in order to determine whether the soft decoding function should be disabled, wherein the threshold can be any suitable number, e.g. 2, 3, 4, and so on. In an embodiment, the threshold may also be 0. That is, after the flash memory controller 110 and the flash memory module 120 are powered-on, the decoder 134 directly disables the soft decoding function, i.e. sequentially decoding chunks of the aforementioned pages (e.g. P36-P44) without using the soft decoding function from the start.

In another embodiment of the present invention, the data quality of blocks in the flash memory module 120 will decrease with the increase of the times of erasing blocks. Hence, to prevent from data loss during the aforementioned data restoring process due to disabling the soft decoding function, the soft decoding function of the decoder 134 of the above embodiment will be disabled only when the number of erasing times of the specific block 500 exceeds a threshold. For example, after the flash memory controller 110 and the flash memory module 120 are powered-on and initialized, the microprocessor 122 will check the number of erasing times of the specific block 500 on a related table stored in the flash memory controller 110. If the erase time of the specific block 500 exceeds the threshold (e.g. 600 times), the soft decoding function of the decoder 134 will be always enabled during the decoding process, that is, the decoding will be performed as soon as the hard decoding performed on a chunk fails. Further, if the number of erasing times of the specific block 500 is not higher than the threshold, the decoder 134 will enable the soft decoding function on the chucks in the beginning of the decoding, and if the accumulated number of chunks performed with soft decoding has reached another threshold, the decoder 134 disables the soft decoding function, similar to the operations in Steps 406-412.

In another embodiment of the present invention, since the data quality of the blocks in the flash memory module 120 drops with the rise of the temperature, to avoid data loss in the aforementioned data restoring process due to disabling the soft decoding function, the soft decoding function of the decoder 134 will only performed when the temperature of the flash memory module 120 is not higher than a threshold. For example, a temperature sensing circuit may be set in the flash memory module 120 for detecting the temperature of the flash memory module 120 whenever necessary, and the temperature sensing circuit may record the temperature value record into a register thereof. After the flash memory controller 110 and the flash memory module 120 are powered-on and initialized, the microprocessor 122 polls the flash memory module 120 to obtain the temperature value thereof, and if the temperature value of the flash memory module 120 is higher than a threshold, the soft decoding function of the decoder 134 will be enabled throughout the decoding process, that is, after the hard decoding on a chunk fails, the chuck will be performed with soft decoding. Further, if the temperature value of the flash memory module 120 is not higher than the threshold, the decoder 134 enables the soft decoding function upon the beginning of decoding said chunks; and when the number of chunk performed with soft decoding reaches another threshold; the decoder 134 disables the soft decoding function, similar to the operations in Steps 406-412.

In another embodiment of the present invention, the method of disabling the soft decoding function of the decoder 134 mentioned in the above embodiment is performed only when the number of erasing times of the specific block 500 is smaller than a first threshold and the temperature of the flash memory module 120 is not higher than a second threshold. More specifically, after the flash memory controller 110 and the flash memory module 120 are powered-on and initialized, if the number of erasing times of the specific block 500 is higher than the first threshold, or the temperature value of the flash memory module 120 is higher than the second threshold, the soft decoding function of the decoder 134 will be enabled throughout the entire decoding process, that is, after the hard decoding performed on a chunk fail, the chuck will be performed with soft decoding. Further, if the erasing times of the specific block 500 is not higher than the first threshold and the temperature value of the flash memory module 120 is not higher than the second threshold, the decoder 134 enables the soft decoding function upon the beginning of decoding said chunks; and when the number of the chunks performed with soft decoding has reached another threshold, the decoder 134 disables the soft decoding function, similar to the operations in Steps 406-412.

To summarize, with the flash memory controller and associated management method of the present invention, after the flash memory controller and flash memory module thereof are powered-on, the decoder therein determines whether the soft decoding function should be disabled according to the state of the read data (e.g. number of chunks s performed with soft decoding), the state (e.g. erasing times) of the block where the read data is located, and/or the temperature of the flash memory module. The present invention is capable of speeding up the boot time of the flash memory controller and the flash memory module, and thus can prevent from booting overtime and poor user experiencing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, wherein the flash memory controller is arranged to access a flash memory module, the flash memory module comprises multiple blocks, and the flash memory controller comprises:
   a read-only memory (ROM), arranged to store a program code;
   a microprocessor, arranged to execute the program code in order to control the access of the flash memory module; and
   a decoder, comprising a hard decoding function and a soft decoding function;
   wherein when the flash memory controller and the flash memory module are powered-on, the flash memory controller reads data from a specific block in the flash memory module, and the decoder determines whether to disable the soft decoding function during decoding the data according to at least the state of the specific block or the state of the data;
   wherein the specific block is a lastly-written block before the flash memory module is powered-on, and said data is contents stored in last few pages in the specific block.

2. The flash memory controller of claim 1, wherein the decoder determines whether to disable the soft decoding function during decoding said data according to the state of the specific block, the state of said data and the temperature of the flash memory module.

3. The flash memory controller of claim 2, wherein when a number of erase times of the specific block is higher than a first threshold and the temperature of the flash memory module is higher than a second threshold; the decoder enables the soft decoding function during decoding said data.

4. The flash memory controller of claim 3, wherein when the number of erase times of the specific block is not higher than the first threshold and the temperature of the flash memory module is not higher than the second threshold, the decoder enables the soft decoding function in the beginning of decoding said data; said data comprises multiple chunks; during sequentially decoding said multiple chunks, the decoder accumulates a number of chucks that require using the soft decoding function; and when said number of chunks reaches a third threshold, the decoder disables the soft decoding function, and the decoder only use the hard decoding function to decode remaining chunks.

5. The flash memory controller of claim 1, wherein the decoder generates a decoded data after decoding said data, and the microprocessor writes the decoded data into a temporary block in said multiple blocks of the flash memory module; and after all the decoded data is stored into the temporary block, the microprocessor further moves the decoded data from the temporary block to the specific block or another block, and recreates a logic address and a physical address mapping table of the decoded data.

6. The flash memory controller of claim 1, wherein the decoder is a Low-Density Parity Check (LDPC) decoder.

7. A flash memory controller, wherein the flash memory controller is arranged to access a flash memory module, the flash memory module comprises multiple blocks, and the flash memory controller comprises:
   a read-only memory (ROM), arranged to store a program code;
   a microprocessor, arranged to execute the program code in order to control the access of the flash memory module; and
   a decoder, comprising a hard decoding function and a soft decoding function;
   wherein when the flash memory controller and the flash memory module are powered-on, the flash memory controller reads data from a specific block in the flash memory module, and the decoder determines whether to disable the soft decoding function during decoding the data according to at least the state of the specific block or the state of the data;
   wherein said data comprises multiple chunks; during sequentially decoding said multiple chunks, the decoder accumulates a number of chunks that require using the soft decoding function; and when said number of chunks reaches a threshold, the soft decoding function is disabled and the decoder only uses the hard decoding function to decode remaining chunks.

8. A flash memory controller, wherein the flash memory controller is arranged to access a flash memory module, the flash memory module comprises multiple blocks, and the flash memory controller comprises:
   a read-only memory (ROM), arranged to store a program code;
   a microprocessor, arranged to execute the program code in order to control the access of the flash memory module; and
   a decoder, comprising a hard decoding function and a soft decoding function;
   wherein when the flash memory controller and the flash memory module are powered-on, the flash memory controller reads data from a specific block in the flash memory module, and the decoder determines whether to disable the soft decoding function during decoding the data according to at least the state of the specific block or the state of the data;

wherein the decoder determines whether to disable the soft decoding function during decoding said data according to a number of erase times of the specific block.

9. The flash memory controller of claim 8, wherein when the number of erase times of the specific block is higher than a threshold, the decoder enables the soft decoding function during decoding said data.

10. The flash memory controller of claim 9, wherein when the number of erase times of the specific block is not higher than the threshold, the decoder enables the soft decoding function in the beginning of decoding said data; said data comprises multiple chunks; during sequentially decoding said multiple chunks, the decoder accumulates a number of chunks that require using the soft decoding function; and when said number of chunks reaches another threshold, the decoder disables the soft decoding function, and the decoder only uses the hard decoding function to decode remaining chunks.

11. A flash memory controller, wherein the flash memory controller is arranged to access a flash memory module, the flash memory module comprises multiple blocks, and the flash memory controller comprises:

a read-only memory (ROM), arranged to store a program code;

a microprocessor, arranged to execute the program code in order to control the access of the flash memory module; and a decoder, comprising a hard decoding function and a soft decoding function;

wherein when the flash memory controller and the flash memory module are powered-on, the flash memory controller reads data from a specific block in the flash memory module, and the decoder determines whether to disable the soft decoding function during decoding the data according to at least the state of the specific block or the state of the data;

wherein the decoder determine whether to disable the soft decoding function during decoding said data further according to temperature of the flash memory module;

wherein when the temperature of the flash memory module is higher than a threshold, the decoder enables the soft decoding function during decoding said data:

wherein when the temperature of the flash memory module is not higher than the threshold, the decoder enables the soft decoding function in the beginning of decoding said data; said data comprises multiple chunks; during sequentially decoding said multiple chunks, the decoder accumulates a number of chucks that require using the soft decoding function; and when said number of chunks reaches another threshold, the decoder disables the soft decoding function, and the decoder only uses the hard decoding function to decode remaining chunks.

12. A method of managing a flash memory module, wherein the flash memory module comprises multiple blocks, and the method comprises:

when the flash memory module is powered-on, reading data from a specific block in the flash memory module; and determining a setting of a decoder at least according to the state of the specific block or the state of said data, in order to control the decoder whether to disable a soft decoding function during decoding said data and to only use a hard decoding function to decode at least one portion of said data;

wherein said data comprises multiple chunks, and the step of determining a setting of a decoder at least according to the state of the specific block or the state of said data in order to control the decoder whether to disable a soft decoding function during decoding said data and to control the decoder to only use a hard decoding function to decode at least one portion of said data comprises:

during sequentially decoding said multiple chunks, accumulating a number of chunks that require the soft decoding function; and when said number of chunks reaches a threshold, the soft decoding function is disabled, and the decoder only uses the hard decoding function to decode remaining chunks.

13. An electronic device, comprising:

a flash memory module, comprising multiple blocks; and a flash memory controller, arranged to access the flash memory module, wherein the flash memory controller comprises:

a read-only memory (ROM), arranged to store a program code;

a microprocessor, arranged to execute the program code in order to control the access of the flash memory module; and a decoder, comprising a hard decoding function and a soft decoding function;

wherein when the flash memory controller and the flash memory module are powered-on, the flash memory controller reads data from a specific block of the flash memory module, and the decoder determines whether to disable the soft decoding function during decoding said data at least according to the state of the specific block or the state of said data;

wherein said data comprises multiple chunks; during sequentially decoding said multiple chunks, the decoder accumulates a number of chunks that require the soft decoding function; and when said number of chunks reaches a threshold, the decoder disables the soft decoding function, and the decoder only uses the hard decoding function to decode remaining chunks.

* * * * *